US011119060B2

(12) United States Patent
Saraswatula et al.

(10) Patent No.: US 11,119,060 B2
(45) Date of Patent: Sep. 14, 2021

(54) DEFECT LOCATION ACCURACY USING SHAPE BASED GROUPING GUIDED DEFECT CENTERING

(71) Applicant: KLA-TENCOR CORPORATION, Milpitas, CA (US)

(72) Inventors: Jagdish Chandra Saraswatula, Puttaparthi (IN); Martin Plihal, Pleasanton, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/904,379

(22) Filed: Feb. 25, 2018

(65) Prior Publication Data

US 2019/0072505 A1 Mar. 7, 2019

Related U.S. Application Data

(60) Provisional application No. 62/572,789, filed on Oct. 16, 2017.

(30) Foreign Application Priority Data

Sep. 1, 2017 (IN) .............................. 201741030984

(51) Int. Cl.
*G01N 23/2251* (2018.01)
*H01J 37/28* (2006.01)
*G06T 7/00* (2017.01)
*G03F 7/20* (2006.01)

(52) U.S. Cl.
CPC ....... *G01N 23/2251* (2013.01); *G03F 7/7065* (2013.01); *G06T 7/0004* (2013.01); *G06T 7/0006* (2013.01); *H01J 37/28* (2013.01); *G01N 2223/6116* (2013.01); *G06T 2207/10061* (2013.01); *G06T 2207/30148* (2013.01); *H01J 2237/2817* (2013.01)

(58) Field of Classification Search
CPC ........ G01N 23/2251; G01N 2223/6116; G06T 7/0004; H01J 2237/2817
See application file for complete search history.

(56) References Cited

U.S. PATENT DOCUMENTS

| 7,570,796 | B2 | 8/2009 | Zafar et al. |
| 8,041,103 | B2 | 10/2011 | Kulkarni et al. |
| 2006/0269120 | A1 | 11/2006 | Nehmadi et al. |
| 2008/0295047 | A1 | 11/2008 | Nehmadi et al. |
| 2012/0093392 | A1 | 4/2012 | Takagi et al. |
| 2012/0185818 | A1 | 7/2012 | Leu et al. |
| 2017/0186151 | A1 | 6/2017 | Banerjee et al. |

OTHER PUBLICATIONS

ISA/KR, International Search Report and Written Opinion for PCT/US2018/048992 dated Dec. 20, 2018.

*Primary Examiner* — Eliza W Osenbaugh-Stewart
(74) *Attorney, Agent, or Firm* — Hodgson Russ LLP

(57) ABSTRACT

Defect location accuracy can be increased using shape based grouping with pattern-based defect centering. Design based grouping of defects on a wafer can be performed. A spatial distribution of the defects around at least one structure on the wafer, such as a predicted hot spot, can be determined. At least one design based defect property for a location around the structure can be determined. The defects within an x-direction threshold and a y-direction threshold of the structure may be prioritized.

14 Claims, 7 Drawing Sheets

200
DEFECT LOCATION ACCURACY USING SHAPE BASED GROUPING GUIDED DEFECT CENTERING

CROSS-REFERENCE TO RELATED APPLICATIONS

This application claims priority to the patent application filed Sep. 1, 2017 and assigned Indian App. No. 201741030984 and to the provisional patent application filed Oct. 16, 2017 and assigned U.S. App. No. 62/572,789, the disclosures of which are hereby incorporated by reference.

FIELD OF THE DISCLOSURE

This disclosure relates to semiconductor defect detection.

BACKGROUND OF THE DISCLOSURE

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Fabricating semiconductor devices such as logic and memory devices typically includes processing a substrate like a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

The process of inspecting semiconductor wafers to detect defects is important to semiconductor manufacturers. Defects cause wafer yields to decline, causing increases in overall semiconductor manufacturing costs. Wafer inspection systems help a semiconductor manufacturer increase and maintain IC chip yields by detecting defects that occur during the manufacturing process. One purpose of inspection systems is to monitor whether a manufacturing process meets specifications. The inspection system indicates the problem and/or the source of the problem if the manufacturing process is outside the scope of established norms, which the semiconductor manufacturer can then address. For example, these defects can be eliminated by the manufacturer by changing one or more of their designs or processes.

As the dimensions of semiconductor devices decrease, inspection becomes even more important to the successful manufacture of acceptable semiconductor devices because smaller defects can cause the devices to fail. However, as design rules shrink, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

After an inspection process, the local designs at the defect locations (returned by inspection) are grouped by a method called design based grouping (DBG). Depending upon the statistics of these groups, one or more locations from each group are chosen for review sampling. DBG employs an encoding scheme for each corner and surrounding geometry. This information is used to quickly find all patterns that exactly match a given pattern.

By the quantitative nature of its language and coding mechanism, users have difficulty writing "rules" with DBG. This capability can be important because a user knows from experience the vulnerable locations on the layer that are likely to cause defects. The defects arising at these locations can be rare but disastrous, and DBG based review sampling that relies solely on statistics may miss this tiny population if limits are set on the sample size. The DBG methodology also does not explicitly indicate the design violations and weaknesses that cause systematic defects. It only does so by examples of patterns based on defect frequencies of those pattern encodings.

DBG grouping is carried out by performing exact matching, which means that two locations are in a DBG group if their designs match exactly, and the design patterns of two locations that look similar but are numerically different fall into different groups. This can create too many groups. Hence, a sampling which relies on DBG groups may miss an important defect type, or it may sample too many of the same type. These DBG deficiencies may not result in efficient review sampling.

In an example, a "hot" inspection of the wafer is run. A hot inspection is one where the detection threshold (e.g., the minimum difference in die-to-die gray level) to determine whether a pixel is defective is set to a low value. Thus, such a detection recipe would find a large number of "defects." The threshold can be tuned to catch only the real defects and filter out false detections such as noise or nuisance defects. Resulting defect locations are grouped using DBG. Groups that contain defects of interest versus nuisance defects are determined, then all locations where such patterns of interest exist on the die are found (e.g., using a pattern search tool) and inspection sensitivity regions are created at these locations for subsequent inspection recipes. This technique relies on a uniformly hot inspection to discover weak areas. Unfortunately, the resulting number of DBG bins can be excessive and sampling each bin sufficiently may be too cumbersome in terms of review time on a scanning electron microscope (SEM) review tool. Discarding DBG bins containing too few defects from review may result in missing a critical defect type. Also, such a review sampling strategy often ends up reviewing an excessive number of nuisance defects, such as those caused by color changes across dies due to film thickness variations, edge roughness, or other features. This large number of nuisance defects can result in the sample set missing critical defects present in those bins. DBG does not combine structures which have the same noise values, which generates a large number of groups (bins) that cannot be handled by a user to separately tune them. The noise floor calculation is not done for all the structures within one die and group, which can make it unstable due to limited statistics. It also does not consider the noisiness of a certain structure.

In another example, defect inspection and analysis to improve design for manufacturability (DFM) and wafer yield can be an important part of very-large-scale integration (VLSI) chip manufacturing. This analysis finds repeater type failures. The root cause of the repeaters may differ, but can be expressed in combination with design and patterning. Thus, the repeaters are related to specific or multiple pattern types that kill the chip or limit the yield.

However, despite advances in the tool capabilities for review and inspection, the uncertainty of the defect location continues to be a nagging problem. The optical resolution limit, other hardware limitations, and the shrinking critical dimension (CD) all contribute to this uncertainty. This uncertainty limits effective binning of defects and especially for pattern repeaters.

Design information is currently used to characterize the defect population using three techniques. First, DBG groups defects based on the pattern in the relevant vicinity of the reported defect location. Second, design based classification (DBC) classifies defects according to the library of known patterns if those patterns are found in the relevant vicinity of the defects. Third, defect level attributes derived from design are calculated. These attributes include properties like "design pattern density" or "design criticality index," which are calculated based on the reported location of each defect. These existing techniques are based on pattern similarity (e.g., pattern search) or defect attributes as reported by the wafer inspection tool.

None of the existing techniques have the capability to characterize or describe the pattern from the point of view of criticality. The existing techniques also suffer from the defect location inaccuracy of the wafer inspection tool with respect to accurate calculation of any design-based property. Thus, a gap in linking the criticality of the failing pattern to the defect attributes exists, but the wafer inspection tool's location inaccuracy prevents any such analysis.

The existing techniques suffer from other disadvantages. Design information is almost exclusively used for grouping the defect population into bins characterized by identical patterns somewhere in the relevant vicinity of the reported defect location. There is no way to describe or characterize those bins (patterns) from the point of view of a potential failure mechanism. The defect location accuracy with respect to the underlying pattern is limited by the wafer inspection tool resolution. Relevant vicinity is defined by the defect location accuracy (DLA) to account for the tool resolution limits. However, the worse the DLA, the larger the vicinity, and the larger the errors and noise sources in any analysis.

Therefore, what is needed are improved systems and techniques for reviewing defects.

BRIEF SUMMARY OF THE DISCLOSURE

In a first embodiment, a method is provided. Using a processor, design based grouping of defects on a wafer is performed. A spatial distribution of the defects around at least one structure on the wafer is determined using the processor. At least one design based defect property for a location around the structure is determined. The defects within an x-direction threshold and a y-direction threshold of the structure are prioritized using the processor. The structure may be a predicted hot spot on the wafer. Images of the wafer can be received at the processor from a wafer inspection tool.

The wafer can be inspected with a wafer inspection tool.

The design based grouping can include associating the defects with an underlying pattern whereby the defects with a same underlying pattern in a vicinity of the defects are in a same group.

Whether one of the defects is a nuisance can be assessed using the processor.

A location for a failure on the wafer can be found using the processor.

Multiple failure mechanisms on the structure can be identified using the processor.

The method can further include correcting, using the processor, the location using shape based grouping prediction of a probable defect location. The shape based grouping prediction can be compared with the location determined by the spatial distribution analysis using the processor. A criticality to the location around the structure can be assigned using the processor.

In a second embodiment, a system is provided. The system comprises a processor in electronic communication with an electronic data storage unit and a wafer inspection tool. The processor is configured to: perform design based grouping of defects on a wafer; determine a spatial distribution of the defects around at least one structure on the wafer; determine at least one design based defect property for a location around the structure; and prioritize the defects within an x-direction threshold and a y-direction threshold of the structure. The design based grouping is based on images of the wafer from a wafer inspection tool. The wafer inspection tool may be a scanning electron microscope. The processor can be further configured to receive the images of the wafer from the wafer inspection tool. The structure may be a predicted hot spot on the wafer.

The design based grouping can include associating the defects with an underlying pattern whereby the defects with a same underlying pattern in a vicinity of the defects are in a same group.

The processor can be further configured to assess whether one of the defects is a nuisance.

The processor can be further configured to find a location for a failure on the wafer.

The processor can be further configured to identify multiple failure mechanisms on the structure.

The processor can be further configured to: correct the location using shape based grouping prediction of a probable defect location; compare the shape based grouping prediction with the location determined by the spatial distribution analysis; and assign a criticality to the location around the structure.

In a third embodiment, a non-transitory computer-readable storage medium comprising one or more programs is provided. The programs are for executing steps on one or more computing devices. The steps include performing design based grouping of defects on a wafer; determining a spatial distribution of the defects around at least one structure on the wafer; determining at least one design based defect property for a location around the structure; and prioritizing the defects within an x-direction threshold and a y-direction threshold of the structure. The structure may be a predicted hot spot on the wafer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein increase the DLA using shape based grouping (SBG) with pattern-based defect centering. This combination uses design and defect attributes and aids in localizing the defect location beyond the wafer inspection tool's capabilities. For example, design and defect attributes may be used in a probabilistic way.

Patterns around defects can be characterized, which can enable searches for similarities in failure mechanisms and prioritizing patterns according to likelihood of failure or other characteristics. This also can address defect location inaccuracy and, consequently, achieve better accuracy in identifying and characterizing the relevant patterns. Using the learned spatial distribution of a particular hot spot can improve hot spot monitoring capabilities and can improve nuisance event suppression.

Figure 1:
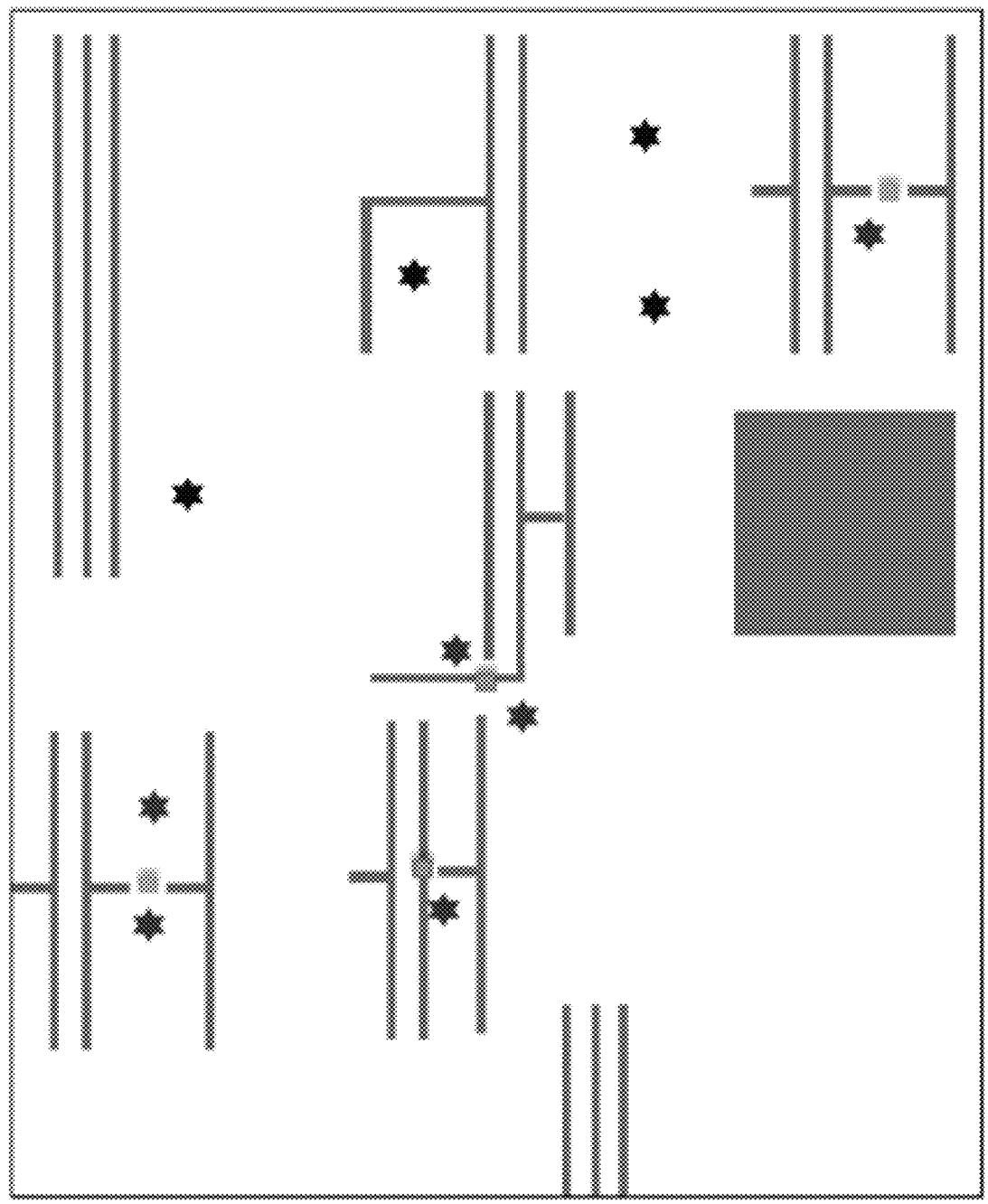
FIG. 1 is an exemplary schematic depicting a chip design with shape based grouping hotspot predictions.

SBG can use a fuzzy search based on probable defect causing mechanism. The embodiments disclosed herein can search for certain polygon combinations within a rule window. The regions marked by SBG present a higher probability of defect occurrence. This provides at least two benefits. First, it can reduce nuisance by removing all those regions which have zero or low probability of failure. Second, it can minimize the location uncertainty by predicting the probable failure location. FIG. 1 shows an exemplary schematic depicting a chip design with SBG hotspot predictions. The stars in FIG. 1 represent defect locations reported by a wafer inspection tool. The SBG hotspot predictions are illustrated with the squares.

Figure 2:
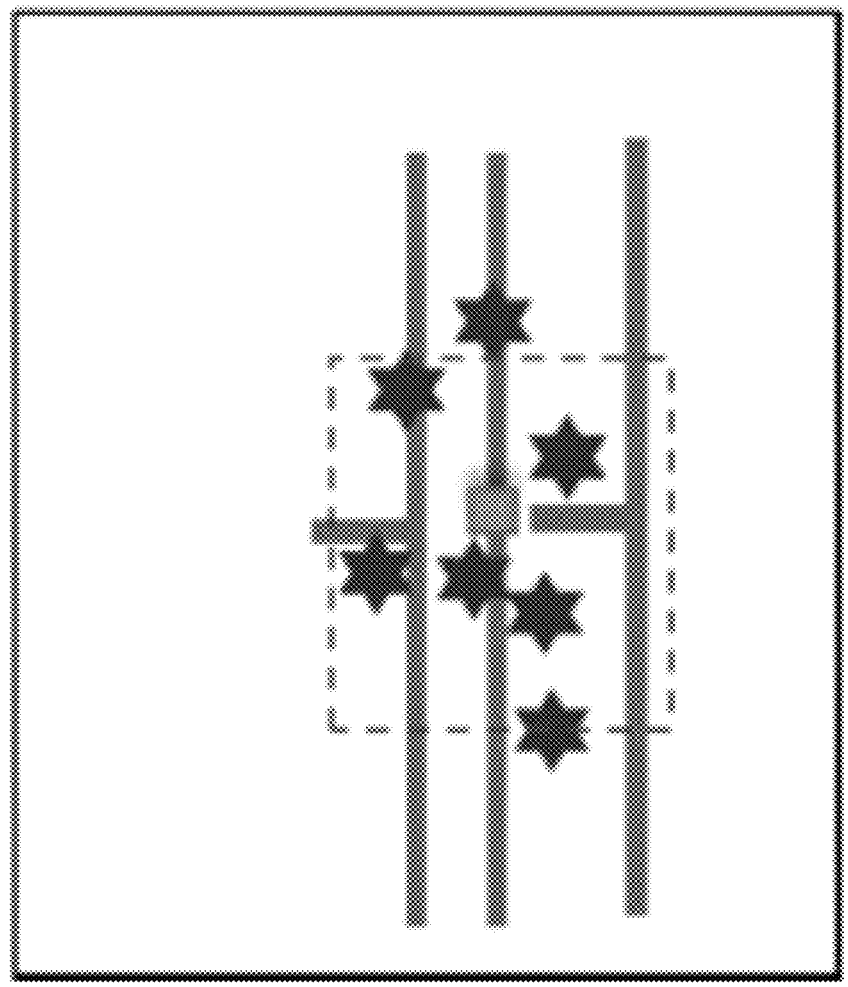
FIG. 2 is an exemplary schematic depicting a chip design with reported defects that are centralized.
Figure 3:
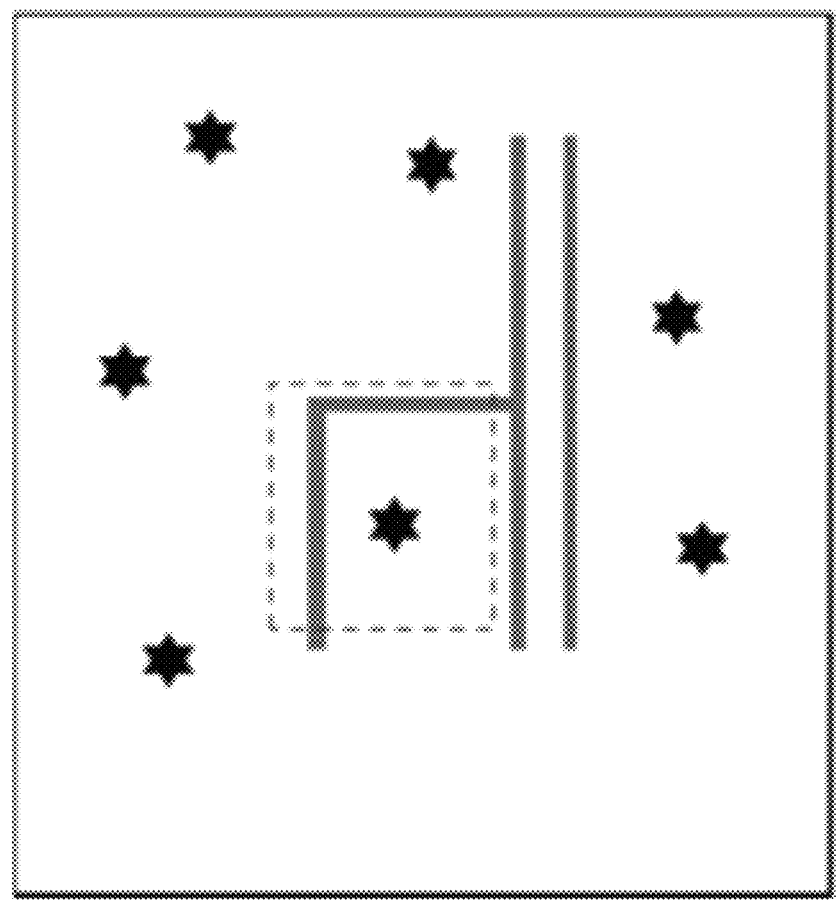
FIG. 3 is an exemplary schematic depicting a chip design with reported defects that are scattered.

DBG can group defects based on frequency of repeating patterns. For example, DBG can group defects that fail in the same pattern into distinct groups. However, the DLA creates a jitter in the location of the defect, such as through stage inaccuracies, defect size effects, or pixel sampling. If all the defect clips within a DBG bin are stacked, this location uncertainty can be plotted and compared with the location predicted by SBG. These plots are illustrated in FIGS. 2 and 3. When the defect clips are stacked, the distribution of reported defect locations around the pattern can be used to get a better estimate of the actual defect location. For example, a mean of the distribution would be the estimated location for unimodal distribution. Furthermore, the uncertainty of the distribution can be compared to the known coordinate accuracy (DLA) of the tool to estimate whether the DBG population corresponds to real defect or nuisance. Nuisance would typically have more random distribution. The estimated location can then be compared with the SBG-predicted location to evaluate the criticality.

Figure 4:
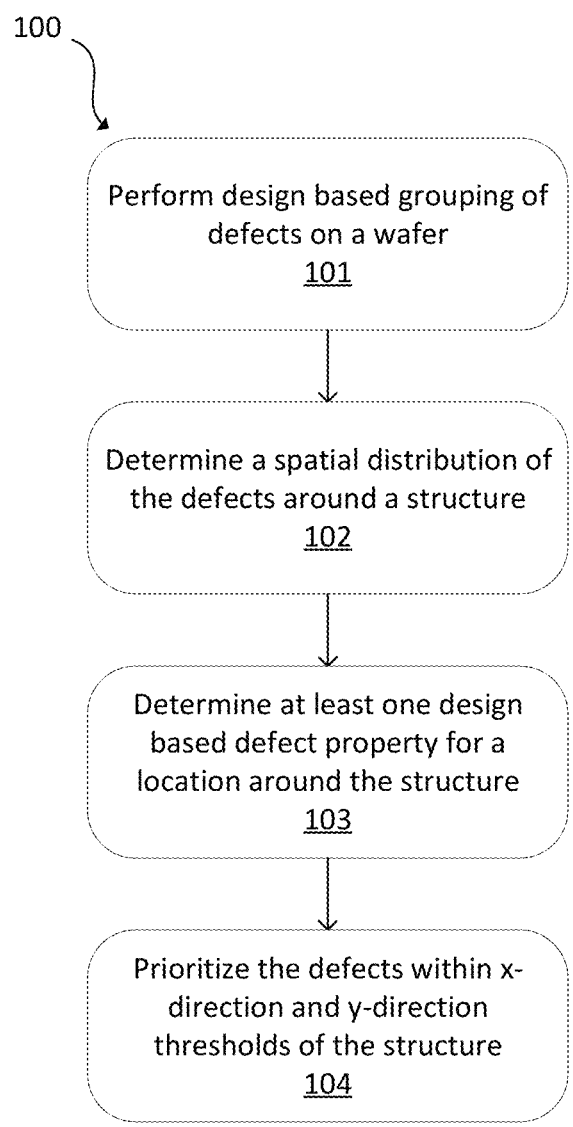
FIG. 4 is a flowchart of an embodiment of a method in accordance with the present disclosure.

FIG. 4 is a flowchart of an embodiment of a method 100. Some or all of the steps in method 100 may be performed using a processor. Prior to step 101, a wafer may be inspected, such as with a wafer inspection tool, and/or images of the wafer from a wafer inspection tool may be received at the processor.

At 101, DBG of defects on a wafer is performed. The DBG can include associating the defects (events) with an underlying pattern or patterns whereby the defects with a same underlying pattern in a vicinity of the defects are in a same group.

A spatial distribution of the defects around at least one structure on the wafer is determined at 102. The structure may be a predicted hot spot on the wafer or another kind of structure. Typically, the DBG clips are centered around a defect. So, if all the defects are stacked by the center or stacked on top of each other, then the spatial distribution of the defects with respect to the design is determined. Whether one or more of the defects likely is a nuisance or a real defect can be assessed. If the defects are all scattered in a region which is greater than the DLA of the system, the probability that the DBG bin is non-defective is higher or the defect might not be design systematics based.

A location for a failure on the wafer can be found. The wafer inspection tool can provide the location based on wafer coordinates. This can lead to finding a more accurate location for an actual failure rather than relying on individual instances that have uncertainty given by a tool's DLA limits. The collective distribution of reported locations in the DBG bin can enable determination of a more accurate location of the defect. If the same structure fails in many different locations in the die and across the wafer, each of the failure occurrences that is detected by the wafer inspection tool will be reported with some location error. However, all these occurrences will get grouped into the same DBG bin. The analysis of the distribution enables reduction of the error (e.g., coordinate averaging.) Furthermore, multiple failure mechanisms on the structure can be identified if present. A search for the failing pattern can be performed to evaluate whether it exhibits other failure types during the second pass inspection.

At least one design based defect property is determined for a location around the structure at 103. Certain designs are more prone to failure, which may be because of overlay problems (e.g., multi-patterning), weak OPC, improper sub-resolution assist feature placement, failure to comply DRC rules, or other properties.

The defects within an x-direction threshold and a y-direction thresholds of the structure are prioritized at 104. Defects within the x-direction and y-direction thresholds may likely be systematic defects and defects outside the x-direction and y-direction thresholds may be nuisance. The thresholds may be set around a location based on a statistical mean of the defect population data for that design. The most common seed vertex location for that particular DBG bin can be used.

A defect location can be corrected using SBG prediction of the probable defect location and comparing it with the location determined by the spatial distribution analysis. A criticality can be assigned to the location around the structure, such as a location determined by the spatial distribution analysis. The SBG based prediction can be used to determine the possible failure location. The SBG can provide theoretical validation to the already existing defect cloud.

The distribution of hot spots and nuisance within a structure can be analyzed to improve the effectiveness of hot spot monitoring. In an instance, this distribution can be learned by a neural network to improve prediction.

Locations with identical or nearly identical patterns can be identified, such as using DBG. Defect detection sensitivity can be selectively improved in localized regions through the use of a technique or system for aligning inspection output to design data with substantially high accuracy (e.g., subpixel), including switching detection algorithms. For example, Nanopoint from KLA-Tencor Corporation may be used when detecting defects. The embodiments described herein enable these and other capabilities by incorporating ultrafast pattern search capabilities based on database indexing into the detection flow. The ultrafast pattern search capabilities described herein can provide other inspection improvements.

The term "design data" as used herein generally refers to the physical design (layout) of an IC and data derived from the physical design through complex simulation or simple geometric and Boolean operations.

The techniques disclosed herein may be useful for hot spot discovery and for driving a more efficient sampling. In particular, these techniques may be used for process window qualification (PWQ) wafers and other design of experiment (DOE) wafers. However, the techniques disclosed herein can be used for hot spot monitoring or with other types of wafers.

Figure 5:
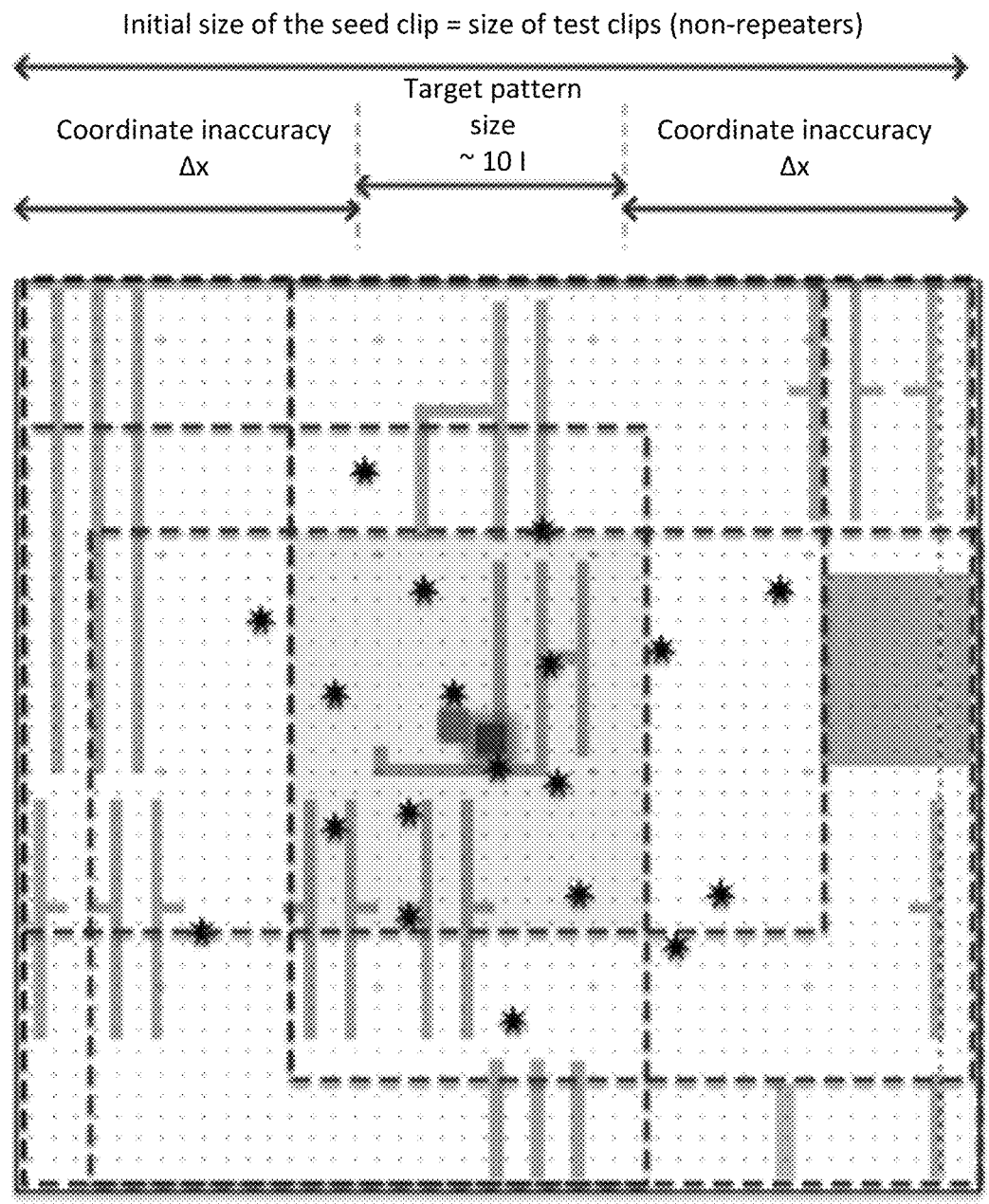
FIG. 5 is an exemplary schematic depicting a chip design with a clip centered on a hot spot.
Figure 6:
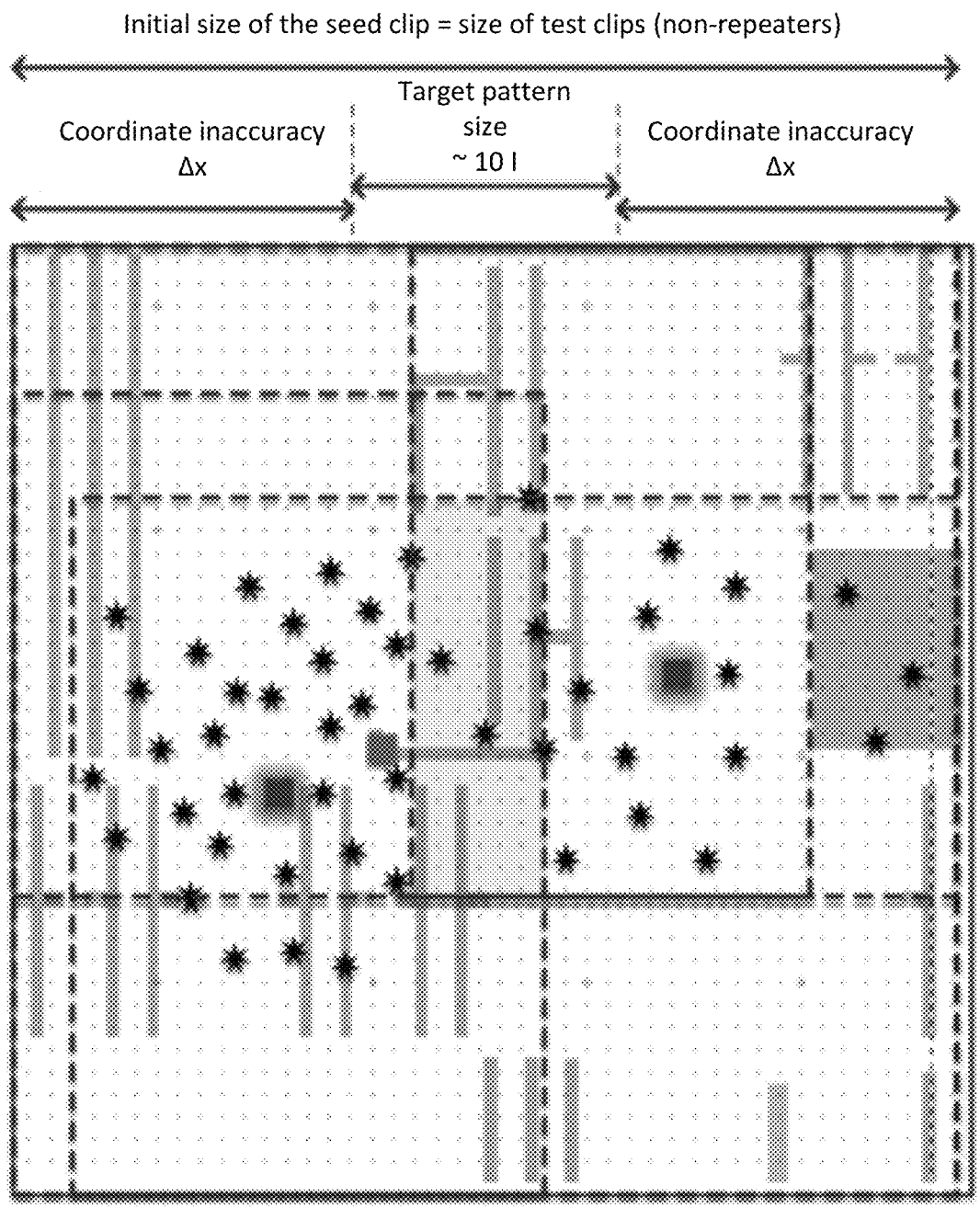
FIG. 6 is an exemplary schematic depicting a chip design with two failing structures separated by distance $r<\sigma_d$.

FIG. 5 is an exemplary schematic depicting a chip design with a clip centered on a hot spot and FIG. 6 is an exemplary schematic depicting a chip design with two failing structures separated by distance $r<\sigma_d$. In FIG. 5, the reported defects will not be exactly in the same location if the structure fails in multiple locations or multiple dies. The stars represent hypothetical positions of the reported effects and the dashed partial squares show the clips of several of those defects overlaid on the clip of the real hot spot. The square denotes the estimated location of the failed structure as defined by the average position of the defects around the structure. The center of the intersection will not generally coincide with the average location because it is defined by the positions of the more irregular outliers. The shaded square around the predicted hot spot represents the $\Delta x$ and $\Delta y$ of the thresholds. The threshold may be a tool specification or may be set using other techniques.

Figure 7:
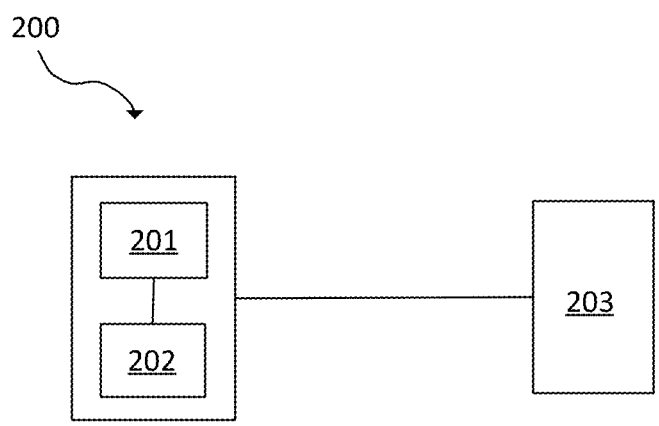
FIG. 7 is a block diagram illustrating an embodiment of a system in accordance with the present disclosure.

FIG. 7 is a block diagram of a system embodiment. The system 200 includes a processor 201 and an electronic storage unit 202 in electronic communication with the processor 201. Both the processor 201 and the electronic storage unit 202 are in electronic communication with the wafer inspection tool 203. The processor 201 may include a microprocessor, a microcontroller, or other devices. A wafer inspection tool 203, which may be an SEM, can generate information used by the processor 201. The processor 201 and/or the electronic storage unit 202 optionally may be in electronic communication with a wafer metrology tool or wafer review tool (not illustrated) to receive additional information.

The processor 201 and electronic storage unit 202 may be part of the wafer inspection tool 203 or another device. In an example, the processor 201 and electronic storage unit 202 may be part of a standalone control unit or in a centralized quality control unit. Multiple processors 201 or electronic storage unit 202 may be used.

The processor 201 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 201 to implement various methods and functions may be stored in readable storage media, such as a memory in the electronic storage unit 202 or other memory.

The processor 201 may be coupled to the components of the system 200 in any suitable manner (e.g., via one or more transmission media, which may include wired and/or wireless transmission media) such that the processor 201 can receive output. The processor 201 may be configured to perform a number of functions using the output.

The processor 201, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a processor for performing defect detection, as disclosed herein. In particular, the processor 201 can be coupled to a memory in the electronic storage unit 202 or other electronic data storage medium with non-transitory computer-readable medium that includes program instructions executable on the processor 201. The computer-implemented method may include any step(s) of any method(s) described herein. For example, the processor 201 may be programmed to perform some or all of the steps of FIG. 4 or other embodiments disclosed herein.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an instance, the processor 201 is configured to perform design based grouping of defects on a wafer; determine a spatial distribution of the defects around at least one structure on the wafer; determine at least one design based defect property for a location around the structure; and prioritize the defects within an x-direction threshold and a y-direction threshold of the structure. The design based grouping can be based on images of the wafer from a wafer inspection tool. The wafer inspection tool may be an SEM. The structure may be a predicted hot spot on the wafer.

The design based grouping can include associating the defects with an underlying pattern whereby the defects with a same underlying pattern in a vicinity of the defects are in a same group.

In an instance, the processor 201 is further configured to receive images of the wafer from a wafer inspection tool.

In an instance, the processor 201 is further configured to assess whether one of the defects is a nuisance.

In an instance, the processor 201 is further configured to find a location for a failure on the wafer. Through analysis of defect location distribution around each pattern defined by the DBG group, the location may be a more accurate location.

In an instance, the processor 201 is further configured to identify multiple failure mechanisms on the structure.

In an instance, the processor 201 is further configured to correct the location using shape based grouping prediction of a probable defect location; compare the shape based grouping prediction with the location determined by the spatial distribution analysis; and assign a criticality to the location around the structure.

Program instructions implementing methods such as those described herein may be stored on computer-readable medium, such as in the electronic storage unit 202 or other storage medium. The computer-readable medium may be a storage medium such as a magnetic or optical disk, a magnetic tape, or any other suitable non-transitory computer-readable medium known in the art. For example, the memory in the electronic storage unit 202 or other electronic data storage medium may be a storage medium such as a magnetic or optical disk, a magnetic tape, or any other suitable non-transitory computer-readable medium known in the art. In particular, the electronic data storage unit 202 can include persistent storage, random access memory, or a split database.

In an instance, the non-transitory computer-readable storage medium comprises one or more programs for executing the following steps on one or more computing devices. The steps on the non-transitory computer-readable storage medium can include performing design based grouping of defects on a wafer; determining a spatial distribution of the defects around at least one structure on the wafer; determining at least one design based defect property for a location around the structure; and prioritizing the defects within an x-direction threshold and a y-direction threshold of the structure. The structure may be a predicted hot spot on the wafer. The steps on the non-transitory computer-readable storage medium also can include some or all of the steps of FIG. 4 or other embodiments disclosed herein.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of improving defect location accuracy comprising:
grouping defects on a wafer using a processor, wherein the grouping is based on images of the wafer received at the processor from a wafer inspection tool, wherein the grouping includes associating the defects with an underlying pattern whereby the defects with a same underlying pattern in a vicinity of the defects are classified in a same group;
prioritizing, using the processor, the defects within an x-direction threshold and a y-direction threshold around at least one structure on the wafer, wherein the threshold includes an area larger than the structure;
binning defects at or within the x-direction threshold and the y-direction threshold around the structure as systematic defects and defects outside of the x-direction threshold or the y-direction threshold as nuisance;
correcting, using the processor, a location of a defect using shape based grouping prediction of a probable defect location;
comparing, using the processor, the shape based grouping prediction with a location determined by a degree of scattering of the defects around the structure on the wafer; and
assigning, using the processor, a criticality to the location around the structure.

2. The method of claim 1, further comprising inspecting the wafer with a wafer inspection tool.

3. The method of claim 1, wherein the structure is a predicted hot spot on the wafer.

4. The method of claim 1, further comprising assessing, using the processor, whether one of the defects is a nuisance.

5. The method of claim 1, further comprising identifying, using the processor, multiple failure mechanisms on the structure.

6. The method of claim 1, further comprising receiving images of the wafer from a wafer inspection tool at the processor.

7. A system for improving defect location accuracy comprising:
a processor in electronic communication with an electronic data storage unit and a wafer inspection tool, wherein the processor is configured to:
group defects on a wafer based on images of the wafer received at the processor from a wafer inspection tool, wherein the grouping includes associating the defects with an underlying pattern whereby the defects with a same underlying pattern in a vicinity of the defects are classified in a same group;
prioritize the defects within an x-direction threshold and a y-direction threshold around at least one structure on the wafer, wherein the threshold includes an area larger than the structure;
bin defects at or within the x-direction threshold and the y-direction threshold around the structure as systematic defects and defects outside of the x-direction threshold or the y-direction threshold as nuisance;
correct a location of a defect using shape based grouping prediction of a probable defect location;

compare the shape based grouping prediction with a location determined by a degree of scattering of the defects around the structure on the wafer; and assign a criticality to the location around the structure.

8. The system of claim 7, wherein the wafer inspection tool is a scanning electron microscope.

9. The system of claim 7, wherein the processor is further configured to receive the images of the wafer from the wafer inspection tool.

10. The system of claim 7, wherein the structure is a predicted hot spot on the wafer.

11. The system of claim 7, wherein the processor is further configured to assess whether one of the defects is a nuisance.

12. The system of claim 7, wherein the processor is further configured to identify multiple failure mechanisms on the structure.

13. A non-transitory computer-readable storage medium for improving defect location accuracy, comprising one or more programs for executing the following steps on one or more computing devices:

group defects on a wafer based on images of the wafer received at the processor from a wafer inspection tool, wherein the grouping includes associating the defects with an underlying pattern whereby the defects with a same underlying pattern in a vicinity of the defects are classified in a same group;

prioritize the defects within an x-direction threshold and a y-direction threshold around at least one structure on the wafer, wherein the threshold includes an area larger than the structure;

bin defects at or within the x-direction threshold and the y-direction threshold around the structure as systematic defects and defects outside of the x-direction threshold or the y-direction threshold as nuisance;

correct a location of a defect using shape based grouping prediction of a probable defect location;

compare the shape based grouping prediction with a location determined by a degree of scattering of the defects around the structure; and assign a criticality to the location around the structure.

14. The non-transitory computer-readable storage medium of claim 13, wherein the structure is a predicted hot spot on the wafer.

* * * * *